US006988252B2

(12) United States Patent
Andreev et al.

(10) Patent No.: US 6,988,252 B2
(45) Date of Patent: Jan. 17, 2006

(54) UNIVERSAL GATES FOR ICS AND TRANSFORMATION OF NETLISTS FOR THEIR IMPLEMENTATION

(75) Inventors: Alexander E. Andreev, San Jose, CA (US); Ranko Scepanovic, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 142 days.

(21) Appl. No.: 10/633,856

(22) Filed: Aug. 4, 2003

(65) Prior Publication Data

US 2005/0030067 A1    Feb. 10, 2005

(51) Int. Cl.
*G06F 17/50* (2006.01)
(52) U.S. Cl. .......................................................... 716/3
(58) Field of Classification Search .................. 716/1, 716/3, 18; 326/37–41, 49–50
See application file for complete search history.

(56) References Cited

U.S. PATENT DOCUMENTS 5,787,010 A * 7/1998 Schaefer et al. ................ 716/7
6,107,819 A * 8/2000 Doyle ........................... 326/37

OTHER PUBLICATIONS

Nanda et al., "A New Methodology for the Design of Asynchronous Digital Circuits," IEEE, Jan. 1997, pp. 342-347.*

* cited by examiner

*Primary Examiner*—Vuthe Siek
(74) *Attorney, Agent, or Firm*—Westman, Champlin & Kelly

(57) ABSTRACT

An original netlist is transformed to one employing universal gates. A negation net is created for each net coupled to an input or output of each gate and an input of each inverter in the original net. Each gate is removed from the original netlist and a universal gate is inserted so that the nets previously coupled to the inputs and output of the removed gate and a negation of those nets are coupled to the inputs and outputs of the inserted universal gate in a selected arrangement. Each inverter is removed from the original netlist and the net previously coupled to the input of the inverter is negated. A universal gate comprises gates performing anding and oring functions whose inputs and outputs are selectively coupled to the nets of the original netlist, and their negations.

18 Claims, 5 Drawing Sheets

| a b | z |
|---|---|
| 0 0 | 1 |
| 0 1 | 1 |
| 1 0 | 1 |
| 1 1 | 0 |

Truth Table

| a b | z |
|---|---|
| 0 0 | 1 |
| 0 1 | 0 |
| 1 0 | 0 |
| 1 1 | 0 |

Truth Table

| a | z |
|---|---|
| 0 | 1 |
| 1 | 0 |

Truth table

FIG. 6
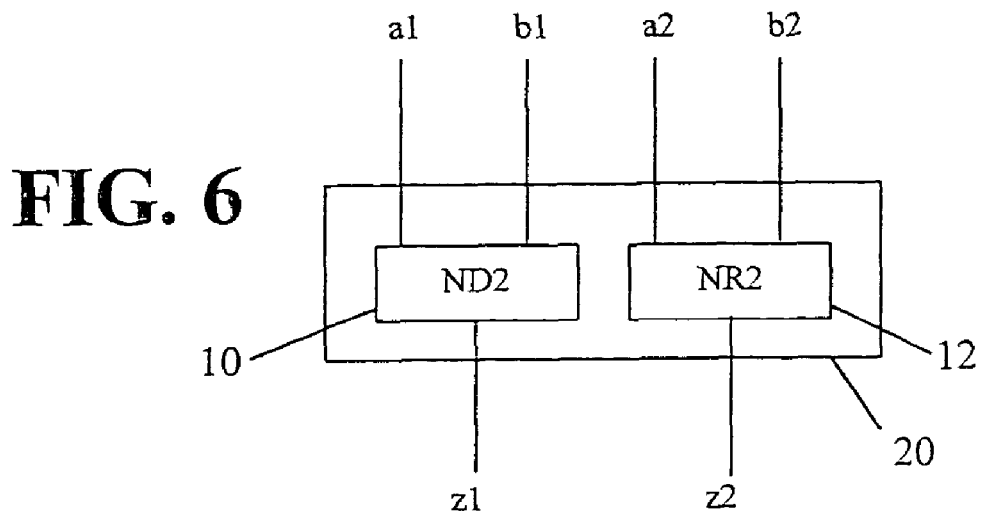
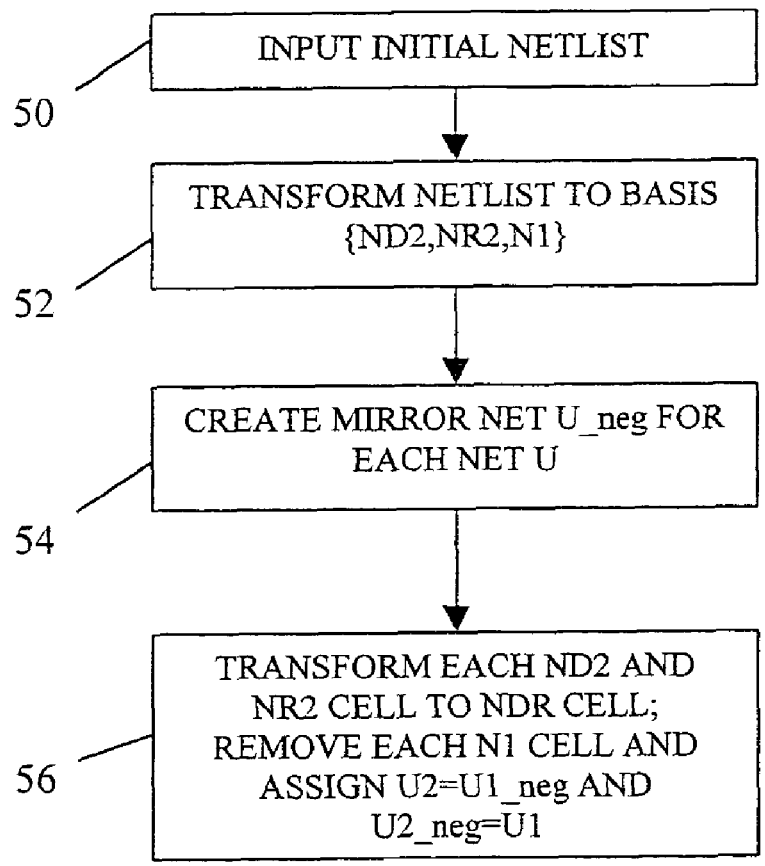
FIG. 7

UNIVERSAL GATES FOR ICS AND TRANSFORMATION OF NETLISTS FOR THEIR IMPLEMENTATION

FIELD OF THE INVENTION

This invention relates to integrated circuits and particularly to implementation of universal gates in integrated circuits.

BACKGROUND OF THE INVENTION

One step in designing integrated circuits (ICs) is the creation of a gate-level description of the circuit, known as a "netlist", that lists the nets and the gate pins that must be connected together. A netlist may be generic or technology-specific. A generic netlist is one that has not yet been correlated to a technology-specific library of cells. The technology-specific netlist, also known as a "mapped netlist", is one that has been mapped to a particular technology-specific library of cells. The cell library to which a technology-specific netlist is mapped defines cells that are to be including in the physical IC chip.

Some IC design efforts commence with a semiconductor platform having selected standard blocks of cells. Custom metal layers are added to the chip to customize the chip for a given requirement. The netlist defining the chip is mapped to the library of standard cell blocks to select the blocks for the chip, and to define the metal layers that connect the cell pins. The RapidChip methodology, available from LSI Logic Corporation of Milpitas, Calif., is an example of this type of semiconductor platform and design concept. The RapidChip methodology permits users to design and implement ICs at considerable savings in both time and expense.

Cell libraries increase in size and complexity with increasing size and complexity of ICs. Programmable ICs, such as metal programmable chip architectures, often require large cell libraries, rendering them particularly difficult to design. Increasing library size leads to increasing chances of error in cell selection, thus adding to the complexity and cost of the IC. There is a need, therefore, for smaller, or even single-cell, libraries that would not adversely affect design performance of the IC, particularly to IC design efforts and production using standard blocks of cells and customized metal layers, such as employed in the RapidChip methodology.

SUMMARY OF THE INVENTION

The invention is directed to defining a single cell library centered about a universal cell, and a technique by which a netlist can be transformed to the single cell library without degrading the design performance of the resulting integrated circuit.

In one embodiment, an original netlist is transformed circuit to a final netlist employing only universal gates having four inputs and two outputs. The universal gate is arranged to perform an anding and an oring function, such as a two-input NAND function and a two-input NOR function. The original netlist is input, and a negation net is created for each net coupled to an input or output of each gate and to an input of each inverter. The gates of the original netlist are removed, and the universal gate is inserted such that the nets coupled to the inputs and output of the removed gate and negations of those nets are coupled to the inputs and outputs of the inserted universal gate in a selected arrangement. Each inverter of the original netlist is removed and the net coupled to the input of the inverter is negated.

The original netlist contains first and second two-input gates having inputs a,b and outputs z coupled to respective nets U1,U2,U3, in the form of (.a(U1),.b(U2),.z(U3)). The first gates perform anding functions, such as AND, NAND, etc., and the second gates perform oring functions, such as OR, NOR, etc. In such case each anding gate is removed from the original netlist and a universal gate is inserted in the form (.a1(U1),.b1(U2),.z1(U3),.a2(U1_neg), .b2(U2_neg), .z2(U3_neg)), where U1_neg, U2_neg, U3_neg, are the respective negations of nets U1, U2 and U3. Each oring gate is removed from the original netlist and a universal gate in the form (.a1(U1_neg),.b1(U2_neg),.z1(U3_neg),.a2(U1), .b2(U2), .z2(U3)) is inserted.

The inverters of the original netlist might have inputs a and outputs z coupled to respective nets U4,U5, in the form (.a(U1),.z(U2)). These inverters are removed from the original netlist and the nets are assigned U5=U4_neg and U5_neg=U4.

Another embodiment of the invention is directed to a computer program to operate a computer to carry out the above process.

In accordance with another embodiment of the invention, a universal gate has an anding gate having first and second inputs providing a first output, and an oring gate having third and fourth inputs providing a second output. The inputs are arranged for selective coupling to respective first and second nets and negations of the first and second nets, and the outputs are arranged for selective coupling to a third net and a negation of the third net.

BRIEF DESCRIPTION OF THE DRAWINGS

FIG. 6 is a diagram of a universal gate in accordance with an embodiment of the present invention.

FIG. 7 is a flowchart of a process of transformation of a netlist to one employing only universal gates in accordance with an embodiment of the present invention.

DETAILED DESCRIPTION OF THE PREFERRED EMBODIMENTS

The present invention is directed to a universal cell having optimal timing and to transformation of a netlist to one that contains only instances of this universal cell.

In accordance with the present invention, a given netlist is mapped to an intermediate library containing only three cells, and then the intermediate netlist is mapped into the single cell library. In addition to preventing the performance degradation, the universal cell and transformation tend to improve performance, especially if the original netlist contains many inverters.

Figure 1:
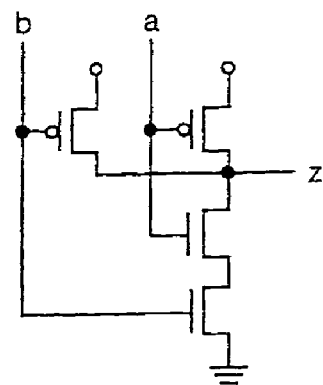
FIGS. 1–3 are diagrams and associated truth tables of basic NAND, NOR and inverter gates useful in explaining the invention.
Figure 2:
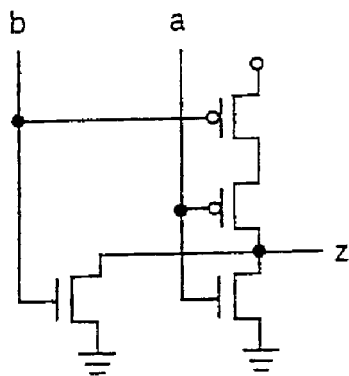
Figure 3:
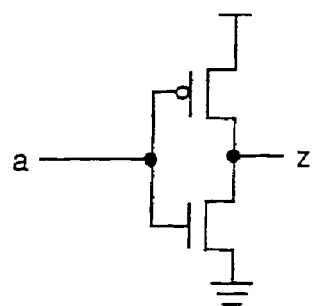

The natural, simplest technology cells are two-input NAND gates, two-input NOR gates and single-input inverters. In some terminologies, these are called "ND2", "NR2" and "N1", respectively. FIG. 1 illustrates a four-transistor NOR gate 10 having inputs a and b and output z. As shown by the truth table, NOR gate 10 provides a true or "1" output when either or both inputs are not true or "0", and a not true or "0" output only when both inputs are true or "1". FIG. 2 illustrates a four-transistor NAND gate 12 having inputs a and b and output z. The associated truth table shows that NAND gate 12 provides a true or "1" output only when both inputs are not true or "0", and a not true or "0" output when either or both inputs are true or "1". FIG. 3 illustrates a two-transistor inverter 14 having input a and output z and whose truth table shows that it provides a true or "1" output when the input is not true or "0", and a not true or "0" output when the input is true or "1".

The gates illustrated in FIGS. 1–3 are the basis of many technology cells in integrated circuits, and many technology cells are represented as circuits in this basis. A cell delay analysis shows that these circuit representations are ones that preserve timing and do not increase delay. For purposes of the present description, "basis {ND2,NR2,N1}" refers to circuits based on cells 10, 12 and 14, and "basic logic" refers to logic functions employing cells 10, 12 and 14.

Figure 4:
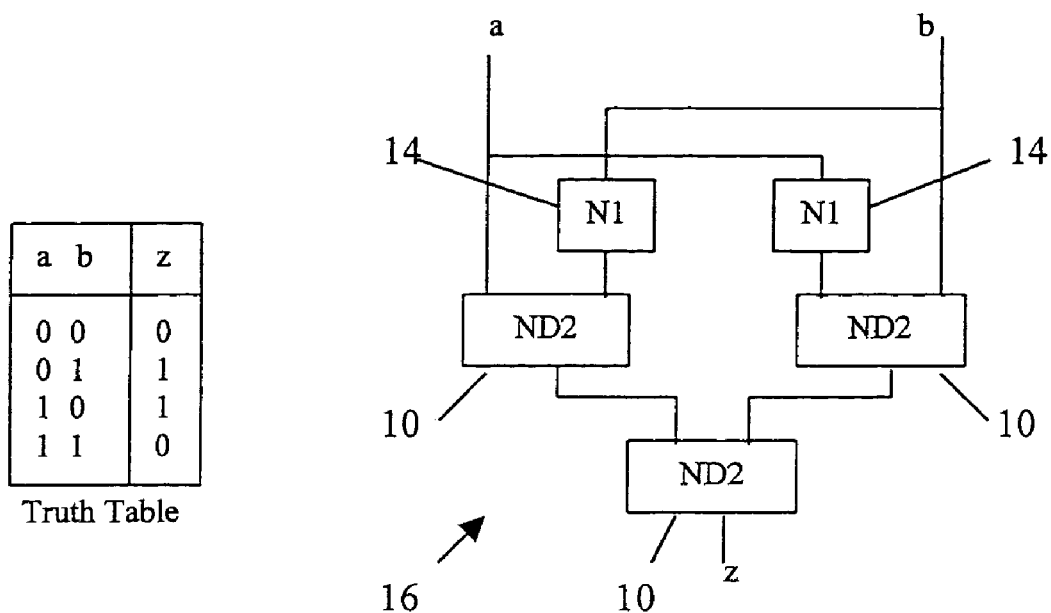
FIGS. 4 and 5 are diagrams of an exclusive-OR function and a multiplexer function using the basic gates shown in FIGS. 1–3.
Figure 5:
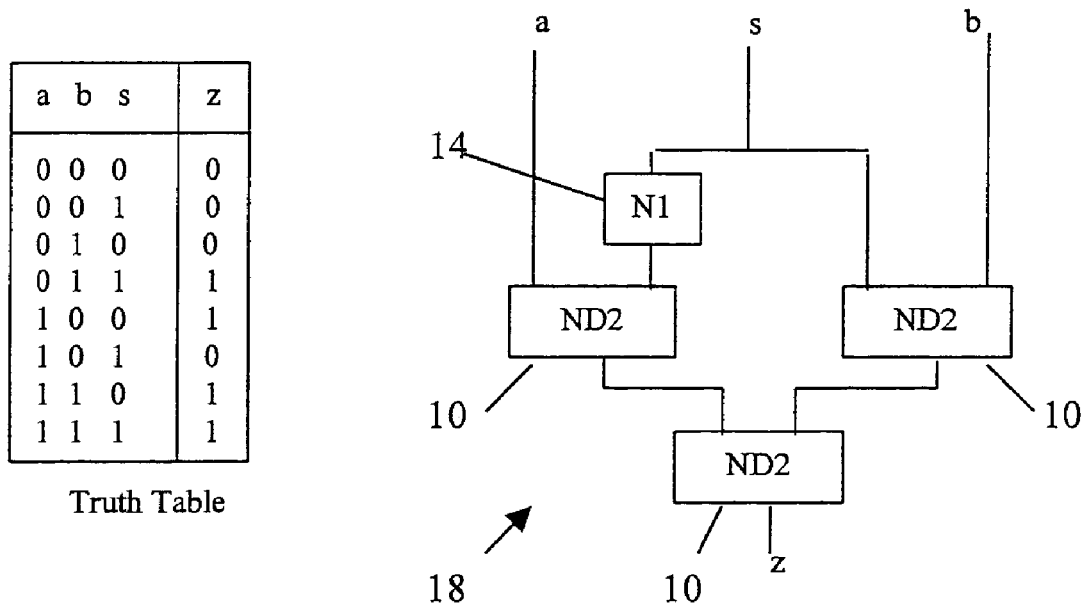

FIGS. 4 and 5 are representations of an exclusive-OR circuit 16 and multiplexer circuit 18, called XOR and MUX, respectively, constructed using basis {ND2,NR2,N1}. Each circuit 16, 18 has a depth of three levels of basic logic, thus having a depth of 3. This is exactly the ratio of actual delays between circuits 16, 18 and the cells of basis {ND2,NR2, N1}.

The universal cell 20, called "NDR", is illustrated in FIG. 6, and consists of one ND2 cell 10 and one NR2 cell 12.

A netlist can be resynthesized to universal cells. A circuit that is functionally equivalent to each library cell is constructed in basis {ND2,NR2,N1} with minimum possible delay. These circuits will be used for local netlist modifications and generation of the intermediate netlist.

For example, each exclusive-OR gate is replaced with circuit 16 shown in FIG. 4, and each muliplexer is replaced with circuit 18 shown in FIG. 5, etc. This process is repeated for all cells in the design, resulting in an intermediate netlist.

FIG. 7 is a flowchart of the process of transforming a netlist to one employing universal gates 20 (FIG. 6). At step 50, an initial netlist is input, and at step 52 the initial netlist is transformed to an intermediate netlist in basis {ND2,NR2, N1}.

Figure 8:
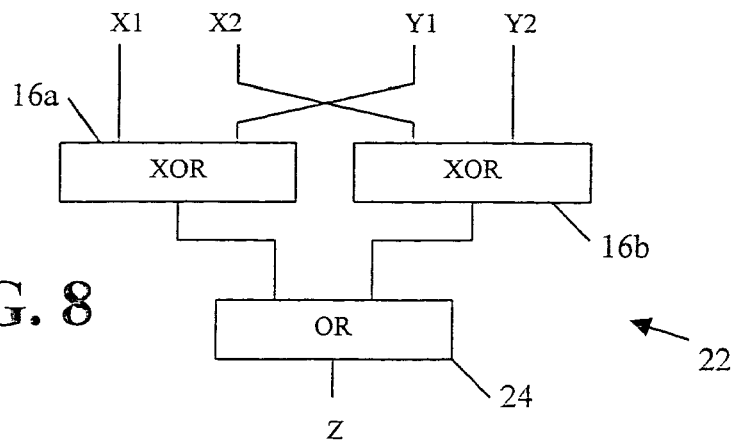
FIGS. 8–10 are diagrams of the steps of transformation of an exclusive-OR function to a netlist formed by the process of FIG. 7.
Figure 9:
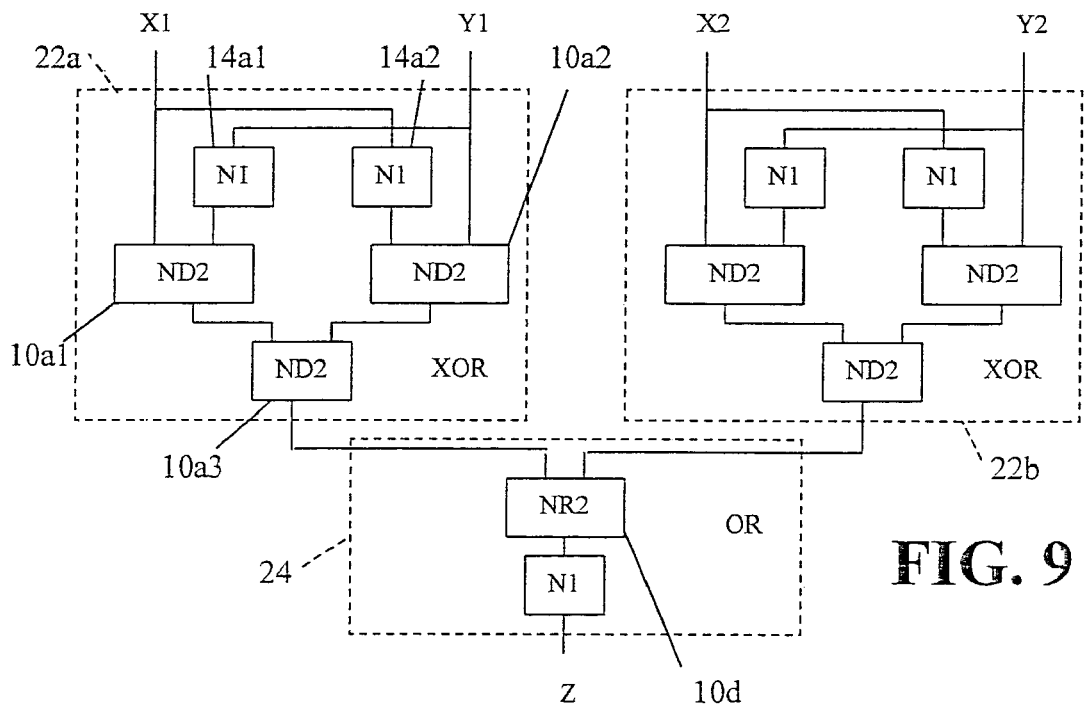

FIGS. 8 and 9 illustrate an example of the transformation of a 2-bit comparator 22 to an intermediate netlist. In FIG. 8, a 2-bit comparator that compares bits X1,X2 to bits Y1,Y2 consists of exclusive-OR gate 16a having X1,Y1 inputs and exclusive-OR gate 16b having X2,Y2 inputs. The outputs of gates 16a and 16b are coupled to OR gate 24 to provide an output of Z. If X1,X2 does not compare to Y1,Y2, Z is true ("1"). Substituting circuit 16 shown in FIG. 4 for each gate 16a and 16b in FIG. 8 results in the transformation to the intermediate netlist shown in FIG. 9. OR gate 24 is transformed to basis {ND1,NR2,N1} using a NAND gate 10 and inverter 14 (FIGS. 1 and 2). The intermediate netlist can be transformed into one employing only universal cells 20 (FIG. 6).

At step 54 (FIG. 7), a mirror net U_neg is created for each net U of the circuit. The logic function of net U_neg is the negation of the U net function.

At step 56, the netlist for cells 10, 12 and 14 is transformed to one for universal cell 20 on a cell-by-cell basis. More particularly, each cell 10 (ND2) having inputs a and b coupled to nets U1 and U2, respectively, and an output z coupled to net U3 is removed, and a universal cell 20 is inserted having inputs a1, b1, a2 and b2 coupled to nets U1, U2, U1_neg and U2_neg, respectively, and outputs z1 and z2 coupled to nets U3 and U3_neg, respectively. Similarly, each cell 12 (NR2) having inputs a and b coupled to nets U1 and U2, respectively, and an output z coupled to net U3 is replaced with a universal cell 20 having inputs a1, b1, a2 and b2 coupled to nets U1_neg, U2_neg, U1 and U2, respectively, and outputs z1 and z2 coupled to nets U3_neg and U3, respectively. It will be appreciated that the output z2 of each gate 20 is the negation of its output z1. In the case of an inverter gate 16 (N1), the gate is removed and the net coupled to the gate is negated.

The algorithm for performing step 56 can be expressed as:

For each instance of

ND2 inst_name(.a(U1),.b(U2),.z(U3)), remove it and create instance

NDR inst_name(.a1(U1),.b1(U2),.z1(U3),.a2 (U1_neg), .b2(U2_neg),.z2(U3_neg)).

For each instance of

NR2 inst_name(.a(U1),.b(U2),.z(U3)), remove it and create instance

NDR inst_name(.a1(U1_neg),.b1(U2_neg),.z1 (U3_neg),.a2(U1), .b2(U2),.z2(U3)).

For each instance of

NR1 inst_name(.a(U1),.z(U2)), remove it and assign

U2=U1_neg,

U2_neg=U1.

The algorithm removes all inverters (N1) from the circuit, thereby reducing delay if the worst-case path (timing-wise) contains inverters in the original netlist. Each NAND (ND2) and each NOR (NR2) is replaced with a universal cell NDR.

Figure 10:
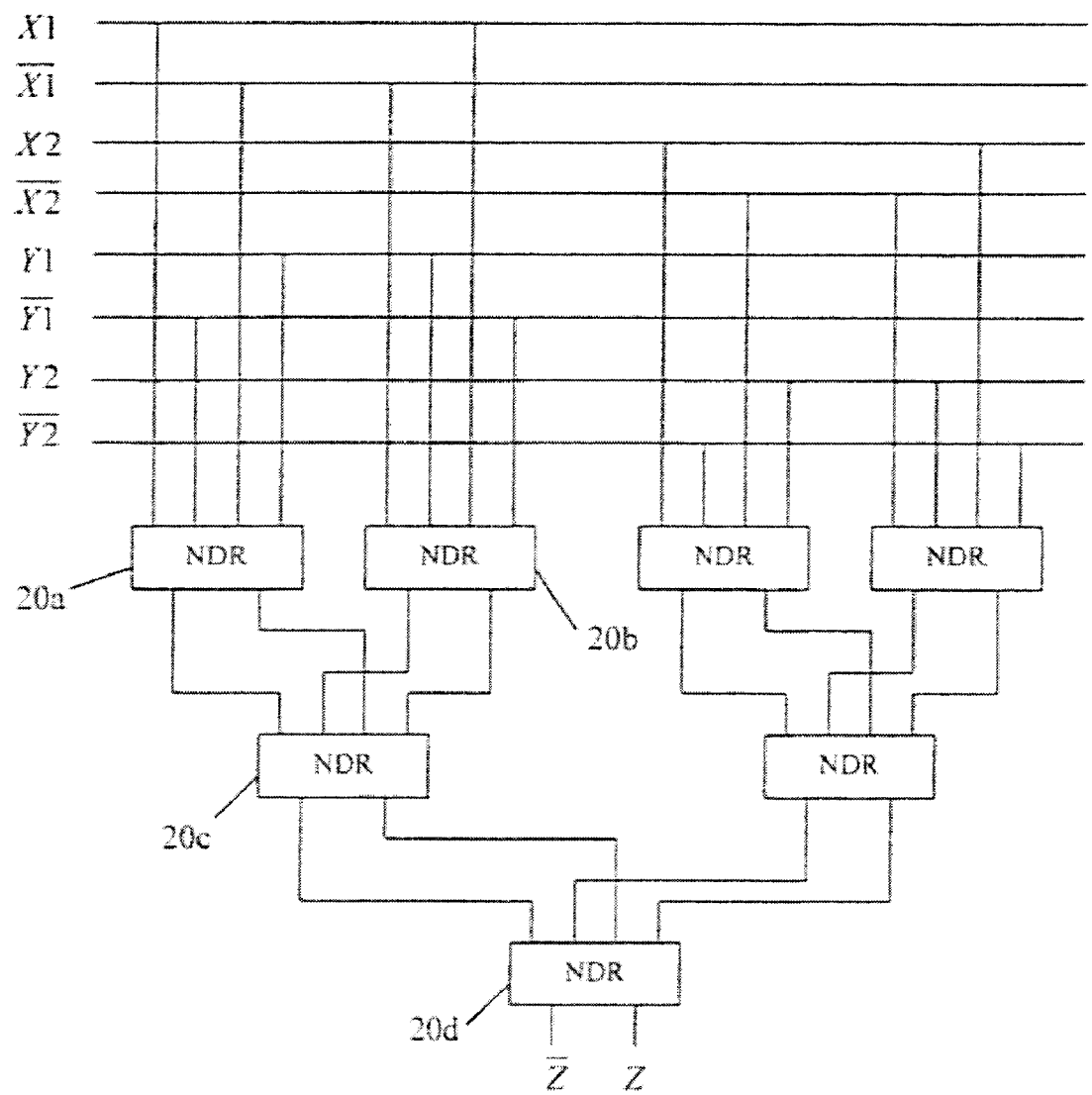

FIG. 10 illustrates the completed netlist derived from the comparator circuit of FIG. 9. Applying the above algorithm to the ND2 gate 10a1 in FIG. 9, gate 10a1 is removed and a new NDR gate 20a is inserted. The a1 and b1 inputs of gate 20a are connected to the nets represented by X1 and Y1 (Y1 being the result of the negation of net Y1 upon removal of inverter 14a1). Similarly, the a2 and b2 inputs are coupled to the nets represented by X1 and Y1. The z1 output of gate 10a1 is coupled to the net represented by Z and the z2 output of gate 10a1 is coupled to the net represented by Z. Similarly, gate 10a2 is removed and new NDR gate 20b is inserted having inputs X1 and Y1 which produces a Z output and inputs X1 and Y1 which produce a Z output. In a like manner, gate 10a3 is removed and gate 20c is inserted.

For OR gate 24 in FIG. 9, gate 10d is removed and new NDR gate 20d inserted. The a1 and b1 inputs are coupled to the U1_neg and U2_neg nets, which are the z2 outputs of gates 10a3 and its counterpart in the transformed exclusive-OR gate 22b, and the a2 and b2 inputs are coupled to the U1 and U2 nets, which are the z1 outputs of gates 10a3 and its counterpart. Removal of the N1 inverter from the OR function negates both the z1 and z2 outputs of gate 20d, thereby effectively reversing the nets to Z and Z as shown.

In preferred embodiments, the process is carried out in a computer or processor operating under control of a computer readable program, such as embodied on a computer useable medium, and containing code that instructs the computer to execute the code and perform the computer steps. The computer useable medium may be any suitable media, such as a hard disc or floppy disc of a suitable magnetic or optical disc drive.

The resulting IC is one containing universal cells 20 and without inverters. If the original netlist contained a large number of inverters, the elimination of inverters might improve performance by reducing delay previously associated with the inverters. The universal cell 20 is particularly useful in designing ICs based on standard blocks of cells in semiconductor platforms.

While the invention has been described in the context of NAND and NOR gates, it is equally applicable to cells having a mirror negation, that is for any cell $F(x\_1, \ldots, x\_n)$ there is a dual cell $G(x\_1, \ldots, x\_n)$ such that $G(x\_1, \ldots, x\_n) = \sim F(\sim x\_1, \ldots, \sim x\_n)$.

Although the present invention has been described with reference to preferred embodiments, workers skilled in the art will recognize that changes may be made in form and detail without departing from the spirit and scope of the invention.

What is claimed is:

1. A process of transforming an original netlist for an integrated circuit to a final netlist employing only universal gates having four inputs and two outputs, the universal gate being arranged to perform at least two logic functions, the process comprising steps of:
   a) input an original netlist in basic form of two-input gates and inverters, each gate and inverter having an output;
   b) creating a negation net for each net coupled to an input or output of each gate and to an input of each inverter;
   c) removing each gate of the original netlist and inserting a universal gate in its stead such that the nets previously coupled to the inputs and output of the removed gate and a negation of those nets are coupled to the inputs and outputs of the inserted universal gate; and
   d) removing each inverter of the original netlist and negating the net previously coupled to the input of the inverter.

2. The process of claim 1, wherein the original netlist contains first gates performing an anding function and second gates performing an oring function, each first and second gate having inputs a,b and outputs z coupled to respective nets U1,U2,U3, in the form of (.a(U1),.b(U2),.z (U3)), and wherein performance of step b creates respective negation nets U1_neg, U2_neg, U3_neg, wherein step c includes:
   removing each first gate from the original netlist and inserting a universal gate in the form (.a1(U1),.b1(U2), .z1(U3),.a2(U1_neg),.b2(U2_neg),.z2(U3_neg)) its stead, and
   removing each second gate from the original netlist and inserting a universal gate in the form (.a1(U1_neg), .b1(U2_neg),.z1(U3_neg),.a2(U1),.b2(U2),.z2(U3)) its stead.

3. The process of claim 2, wherein the first gates are NAND gates and the second gates are NOR gates.

4. The process of claim 2, wherein the original netlist includes inverters having inputs a and outputs z coupled to respective nets U4,U5, in the form of (.a(U1),.z(U2)), wherein step d includes:
   removing each inverter from the original netlist and assigning U5=U4_neg and U5_neg=U4.

5. The process of claim 4, wherein the first gates are NAND gates and the second gates are NOR gates.

6. The process of claim 4, further including:
   e) creating a final netlist based on the results of steps c and d.

7. The process of claim 1, further including:
   e) creating a final netlist based on the results of steps c and d.

8. A universal gate for an integrated circuit comprising:
   a first gate performing an anding function having first and second inputs and providing a first output; and
   a second gate performing an oring function having third and fourth inputs and providing a second output,
   the first, second, third and fourth inputs being arranged for selective coupling to respective first and second nets and negations of the first and second nets, and the first and second outputs being arranged for selective coupling to a third net and a negation of the third net,
   wherein the universal gate replaces a netlist representation of a two-input gate coupled to the first and second nets to perform an anding function, the universal gate being further arranged so that the first and second inputs are coupled to the first and second nets, respectively, the third and fourth inputs are coupled to the negations of the first and second nets, respectively, and the first and second outputs are coupled to the third net and the negation of the third net, respectively.

9. The universal gate of claim 8, wherein the first gate is defined as $F(x\_1, \ldots, x\_n)$ and the second gate is defined as $G(x\_1, \ldots, x\_n)$, where $G(x\_1, \ldots, x\_n) = \sim F(\sim x\_1, \ldots, \sim x\_n)$.

10. The universal gate of claim 8, wherein the first gate is a NAND gate and the second gate is a NOR gate.

11. An integrated circuit composed of universal gates according to claim 8.

12. The integrated circuit of claim 11, characterized by an absence of inverters.

13. A computer useable medium having a computer readable program embodied therein for addressing data to transform an original netlist containing two-input gates and inverters for an integrated circuit to a final netlist employing only universal gates having four inputs and two outputs, the universal gate being arranged to perform at least two logic functions, the computer readable program comprising:
   first computer readable code for causing the computer to create a negation net for each net coupled to an input or output of each gate and to an input of each inverter;
   second computer readable code for causing the computer to remove each gate of the original netlist and inserting a universal gate in its stead such that the nets coupled to the inputs and output of the removed gate and a negation of those nets are coupled to the inputs and outputs of the inserted universal gate; and
   third computer readable code for causing the computer to remove each inverter of the original netlist and negate the net coupled to the input of the inverter.

14. The computer useable medium of claim 13, wherein the original netlist contains first gates performing an anding function and second gates performing an oring function having inputs a,b and outputs z coupled to respective nets U1, U2, U3, in the form of (.a(U1),.b(U2),.z(U3)), and wherein execution of the first computer readable code creates respective negation nets U1_neg, U2_neg, U3_neg, wherein the second computer readable code includes:
   computer readable code for causing the computer to remove each first gate from the original netlist and insert a universal gate in the form (.a1(U1),.b1(U2), .z1(U3),.a2(U1_neg),.b2(U2_neg), .z2(U3_neg)) its stead, and computer readable code for causing the computer to remove each second gate from the original netlist and insert a universal gate in the form (.a1(U1_neg),.b1(U2_neg),.z1(U3_neg),.a2(U1),.b2(U2),.z2(U3)) its stead.

15. The computer useable medium of claim 14, wherein the original netlist includes inverters having inputs a and outputs z coupled to respective nets U4, U5, in the form (.a(U1),.z(U2)), wherein the third computer readable code includes:
    computer readable code for causing the computer to remove each inverter from the original netlist and assign U5=U4_neg and U5_neg=U4.

16. The computer useable medium of claim 15, wherein the first gates are NAND gates and the second gates are NOR gates.

17. The computer useable medium of claim 14, wherein the first gates are NAND gates and the second gates are NOR gates.

18. The computer useable medium of claim 13, further including:
    computer readable code for causing the computer to create a final netlist based on the results of execution of the second and third computer readable codes.

\* \* \* \* \*